United States Patent
He et al.

(10) Patent No.: US 10,211,146 B2
(45) Date of Patent: Feb. 19, 2019

(54) AIR GAP OVER TRANSISTOR GATE AND RELATED METHOD

(71) Applicant: GLOBALFOUNDRIES INC., Grand Cayman (KY)

(72) Inventors: Zhong-Xiang He, Essex Junction, VT (US); Mark D. Jaffe, Shelburne, VT (US); Randy L. Wolf, Essex Junction, VT (US); Alvin J. Joseph, Williston, VT (US); Brett T. Cucci, Essex Junction, VT (US); Anthony K. Stamper, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/152,794

(22) Filed: May 12, 2016

(65) Prior Publication Data
US 2017/0330832 A1    Nov. 16, 2017

(51) Int. Cl.
*H01L 23/522* (2006.01)
*H01L 27/12* (2006.01)
*H01L 23/482* (2006.01)
*H01L 21/768* (2006.01)
*H01L 23/532* (2006.01)

(52) U.S. Cl.
CPC ...... *H01L 23/5222* (2013.01); *H01L 21/7682* (2013.01); *H01L 23/4821* (2013.01); *H01L 27/1203* (2013.01); *H01L 23/5226* (2013.01); *H01L 23/53223* (2013.01); *H01L 23/53238* (2013.01); *H01L 23/53295* (2013.01)

(58) Field of Classification Search
CPC ......... H01L 21/02063; H01L 21/76802; H01L 21/76831; H01L 21/31116; H01L 21/02052; H01L 21/31144; H01L 21/7682; H01L 23/4821; H01L 23/5222; H01L 23/5329; H01L 23/485; H01L 29/7833; H01L 21/76898; H01L 23/481; H01L 23/5227; H01L 28/10
USPC .... 257/288, 774, 758, 759, 522; 438/637, 3, 438/619, 623, 725
See application file for complete search history.

(56) References Cited

U.S. PATENT DOCUMENTS

| | | | |
|---|---|---|---|
| 5,914,519 A | 6/1999 | Chou et al. | |
| 6,165,890 A | 12/2000 | Kohl et al. | |
| 6,211,561 B1 | 4/2001 | Zhao | |
| 6,316,347 B1 | 11/2001 | Chang et al. | |
| 6,917,109 B2 | 7/2005 | Lur et al. | |

(Continued)

FOREIGN PATENT DOCUMENTS

| | | |
|---|---|---|
| DE | 4239319 A1 | 4/1993 |
| DE | 4333875 A1 | 4/1995 |

OTHER PUBLICATIONS

U.S. Appl. No. 15/152,797, Notice of Allowance dated Jun. 26, 2018, 8 pages.

*Primary Examiner* — Mouloucoulaye Inoussa
(74) *Attorney, Agent, or Firm* — David Cain; Hoffman Warnick LLC (57) ABSTRACT

A semiconductor device may include a transistor gate in a device layer; an interconnect layer over the device layer; and an air gap extending through the interconnect layer to contact an upper surface of the transistor gate. The air gap provides a mechanism to reduce both on-resistance and off-capacitance for applications using SOI substrates such as radio frequency switches.

18 Claims, 9 Drawing Sheets

(56) References Cited

U.S. PATENT DOCUMENTS

| | | |
|---|---|---|
| 6,984,577 B1 | 1/2006 | Zhao et al. |
| 7,138,329 B2 | 11/2006 | Lur et al. |
| 7,449,407 B2 | 11/2008 | Lur et al. |
| 7,553,756 B2 | 6/2009 | Hayashi et al. |
| 8,232,618 B2 | 7/2012 | Breyta et al. |
| 8,232,653 B2 | 7/2012 | Lee |
| 8,298,911 B2 | 10/2012 | Lee |
| 8,350,300 B2 | 1/2013 | Aoki |
| 9,659,865 B2 | 5/2017 | Saka et al. |
| 2008/0020488 A1* | 1/2008 | Clevenger ......... H01L 21/76898 438/3 |
| 2008/0308898 A1* | 12/2008 | Gabric ................ C23C 16/308 257/522 |
| 2010/0301489 A1 | 12/2010 | Seidel et al. |
| 2011/0018091 A1* | 1/2011 | Barth ................. H01L 23/5256 257/529 |
| 2011/0193230 A1* | 8/2011 | Nogami ............. H01L 21/0337 257/741 |
| 2012/0037962 A1* | 2/2012 | Breyta .............. H01L 21/31144 257/288 |
| 2012/0058639 A1 | 3/2012 | Sim et al. |
| 2015/0262929 A1 | 9/2015 | Hsiao et al. |
| 2016/0141240 A1* | 5/2016 | Saka .................. H01L 23/4824 257/401 |

* cited by examiner

AIR GAP OVER TRANSISTOR GATE AND RELATED METHOD

BACKGROUND

Technical Field

The present disclosure relates to semiconductor devices, and more specifically, to an air gap over a transistor gate and method of forming the same. The air gap reduces off-state capacitance ($C_{off}$) in applications such as radio frequency switches in semiconductor-on-insulator (SOI) substrates.

Related Art

Radio frequency (RF) switches are widely used in telecommunications equipment such as smartphones to route high frequency telecommunications signals through transmission paths. For instance, RF switches are commonly used in smartphones to allow use with different digital wireless technology standards used in different geographies. Current RF switches are generally fabricated using semiconductor-on-insulator (SOI) substrates. SOI substrates typically use a layered silicon-insulator-silicon substrate in place of a more conventional silicon substrate (bulk substrate). SOI-based devices differ from conventional silicon-built devices in that the silicon junction is above an electrical insulator, typically silicon dioxide or (less commonly) sapphire.

One challenge with RF switches formed in SOI substrates is controlling two competing parameters: on-resistance ($R_{on}$) which is the resistance of the switch when power is switched on, and off-state capacitance ($C_{off}$) which indicates the amount of cross-talk or noise that may occur within the system, i.e., the amount transmitted signals on one circuit creates an undesired effect on another circuit. $R_{on}$ is preferred to be as low as possible when the RF switch is on to reduce the power consumption, and $C_{off}$ should be minimized to reduce undesired coupling noise. In conventional semiconductor manufacturing processes, lowering either $R_{on}$ or $C_{off}$ results in the opposite effect in the other parameter.

SUMMARY

A first aspect of the disclosure is directed to a method of forming an air gap for a semiconductor device, the method comprising: forming an air gap mask exposing a portion of an interconnect layer over a device layer, the device layer including a transistor gate therein; etching an opening through the interconnect layer using the air gap mask above the transistor gate, the opening exposing sidewalls of a dielectric of the interconnect layer; removing the air gap mask; recessing the exposed sidewalls of the dielectric of the interconnect layer in the opening; and forming an air gap over the transistor gate by depositing an air gap capping layer to seal the opening at a surface of the interconnect layer.

A second aspect of the disclosure includes a semiconductor device, comprising: a transistor gate in a device layer; an interconnect layer over the device layer; and an air gap extending through the interconnect layer above the transistor gate.

A third aspect of the disclosure related to a radio frequency semiconductor-on-insulator (RFSOI) switch, comprising: a transistor gate in a semiconductor-on-insulator (SOI) layer of an SOI substrate; an interconnect layer over the SOI layer, the interconnect layer including a local interconnect layer over the SOI layer and a first metal layer over the local interconnect layer; and an air gap extending through a dielectric of the interconnect layer above the transistor gate.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to methods of forming semiconductor devices including an air gap over a transistor gate for reducing the capacitance between the transistor gate and adjacent wires, contacts, and vias used to contact the source and drain of the transistor. This capacitance reduction may decrease the off-state capacitance of the transistor when it is used in in such applications as radio frequency (RF) switches in semiconductor-on-insulator (SOI) substrates or bulk (non-SOI) substrates. Use of an air gap over a transistor gate according to the various embodiments of the disclosure provides a mechanism to reduce off-capacitance of any device using it by controlling one of the main contributors of intrinsic field effect transistor (FET) capacitance: the effective dielectric constant of the contact or local interconnect layer and the first metal layer. While the teachings of the disclosure will be described with regard to an SOI substrate and relative to an RF switch, it will be understood that the embodiments can be applied to various alternative semiconductor devices such as but not limited to low noise amplifiers (LNA) and power amplifiers. Further, the teachings may be applied to different substrates, such as a bulk substrate.

Figure 1:
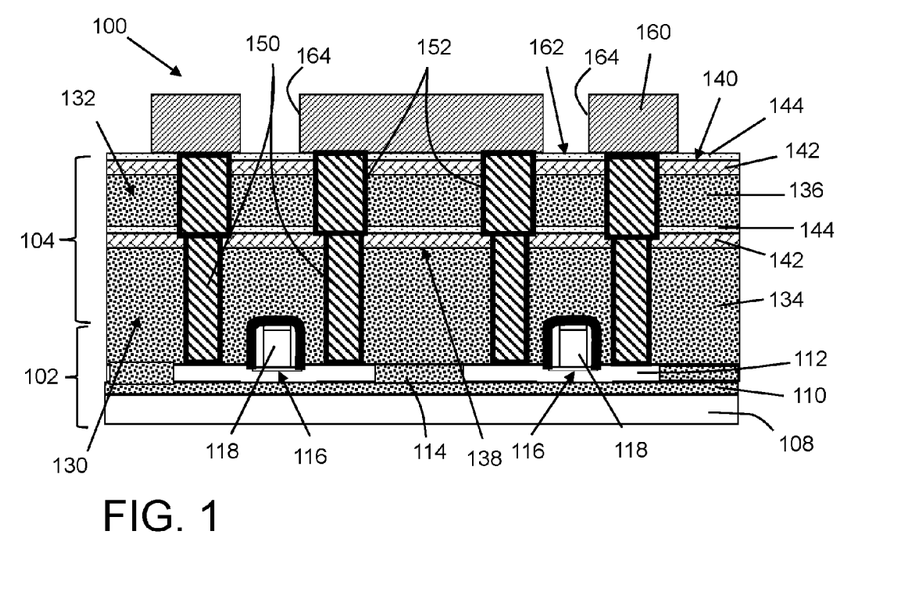
FIG. 1 shows a cross-sectional view of embodiments of a method according to the disclosure.

Referring to FIG. 1, a cross-sectional view of a first process of a method of forming an air gap for a semiconductor device according to embodiments of the disclosure is illustrated. FIG. 1 shows a semiconductor device 100 after formation of a device layer 102 and an interconnect layer 104. Device layer 102 is illustrated as including a semiconductor-on-insulator (SOI) substrate 106 including a semiconductor substrate 108 with an insulator layer 110 thereover and a semiconductor-on-insulator (SOI) layer 112 thereover. Substrate 108 and SOI layer 112 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 108 and/or SOI layer 112 may be strained. For example, SOI layer 112 may be strained. SOI layer 112 may be segmented by shallow trench isolations (STI) 114. Insulator layer 110 may include any appropriate dielectric material for the application desired, e.g., silicon oxide ($SiO_x$) or (less commonly) sapphire. Insulator layer 110 and/or STI 114 may also include the same material, such as silicon dioxide or any other interlayer dielectric material described herein.

Figure 2:
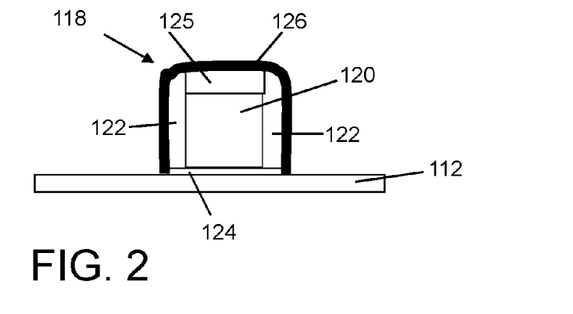
FIG. 2 shows an enlarged cross-sectional view of an illustrative transistor gate.

Device layer 102 also includes a number of transistors 116 formed therein. Each transistor 116 may include any now known or later developed transistor structure such as doped source/drain regions (not labeled) in SOI layer 112 having a transistor gate 118 thereover and therebetween. FIG. 2 shows an enlarged cross-sectional view of an illustrative transistor gate 118. Each transistor gate 118 may include, among other structures, a body 120 of polysilicon or a metal gate conductor (commonly referred to collectively as "PC"), spacers 122 about body 120, a gate dielectric 124 under body 120, a silicide layer 125 over body 120 (i.e., a silicon-metal alloy), and an etch stop layer 126 over silicide layer 125 and/or spacers 122. Spacers 122 may include any now known or later developed spacer material such as silicon nitride ($Si_3N_4$), and gate dielectric 124 may include any now known or later developed gate dielectric material such as: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Etch stop layer 126 may include any now known or later developed etch stop material such as silicon nitride. Silicide layer 125 may include any now known or later developed silicide material, e.g., titanium, nickel, cobalt, etc. As understood, each transistor gate 118 may run into, out of, or across the page as illustrated.

Returning to FIG. 1, interconnect layer 104, as described herein, may include a number of layers including a contact or local interconnect layer 130 (commonly referred to as a contact area (CA) layer) and a first metal layer 132. Each layer 130, 132 may include an interlayer dielectric (ILD) layer 134, 136, respectively. ILD layers 134, 136 may include may but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosphosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Each layer 130, 132 may also include a respective cap layer 138, 140 at an upper surface thereof. Each cap layer 138, 140 may include one or more layers, for example, a silicon oxide layer 142 and an etch stop layer 144, formed from silicon nitride (nitride), silicon carbo nitride (SiCN), etc., as known in the art. As understood, various other forms of cap layers may also be employed. Further, it is emphasized that while cap layers 138, 140 are illustrated as identical, they can be different materials, thicknesses, etc.

A number of contacts 150 may extend through ILD layer 134 of contact or local interconnect layer 130 (hereafter "local interconnect layer 130") to various parts of device layer 102. In the example shown, contacts 150 extend to source/drain regions of transistors 116. As understood, each contact 150 may include a conductor such as aluminum or copper, within a refractory metal liner of ruthenium; however, other refractory metals such as tantalum (Ta), titanium (Ti), tungsten (W), iridium (Ir), rhodium (Rh) and platinum (Pt), etc., or mixtures of thereof, may also be employed. Typically, contacts 150 extend mostly vertically within semiconductor device 100 to connect conductors in layers thereof, i.e., vertically on page as illustrated. First metal layer 132 may include a number of metal wires 152 therein. Each metal wire 152 may use the same materials as listed for contacts 150. In contrast to contacts 150, metal wires 152 extend mostly horizontally or laterally in a layer within semiconductor device 100 to connect contacts 150 therein, i.e., into, out of, or across a page as illustrated. In this manner, first metal layer 132 may include a metal wire 152 extending laterally parallel to transistor gate 118 in device layer 102, i.e., vertically above but parallel to transistor gate 118. Semiconductor device 100 as illustrated in FIG. 1 can be formed using any now known or later developed semiconductor fabrication techniques, e.g., material deposition, photolithographic patterning and etching, doping, etc. Although contacts 150 and wires 152 are shown in FIG. 1 as single damascene levels, they could be formed using as dual damascene levels containing refractory metal lined copper or tungsten, as known in the art.

"Depositing" or "deposition," as used herein, may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1 also shows forming an air gap mask 160 exposing a portion 162 of interconnect layer 104 over device layer 102. Mask 160 may be formed, for example, post first metal layer 132 damascene planarization, e.g., via chemical mechanical polishing (CMP), and may include any now known or later developed masking material. Mask 160 is patterned and etched in a conventional fashion to create openings 164 therein. In one embodiment, transistor gate 118 width is approximately 200 nm and openings 164 in air gap mask 160 may have a size of approximately 0.16 micrometers (um) to 0.24 um, and in particular, 0.2 um. These widths could scale with larger and smaller channel transistor width or with larger or smaller contact 150 and wire 152 width.

FIGS. 3A-E show etching an opening 166 through interconnect layer 104 using air gap mask 160 above transistor gate 118. Opening 166 exposes sidewalls 170 of a dielectric 134, 136 of interconnect layer 104. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., oxide) isotopically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In FIGS. 3A-E, the etching (indicated by arrows in FIG. 3A only) may include a RIE. As used herein, "above the transistor gate" transistor gate 118 as it refers to opening 166 and/or any air gap formed therewith, means overlapping transistor gate 118 in any fashion.

Figure 3A:
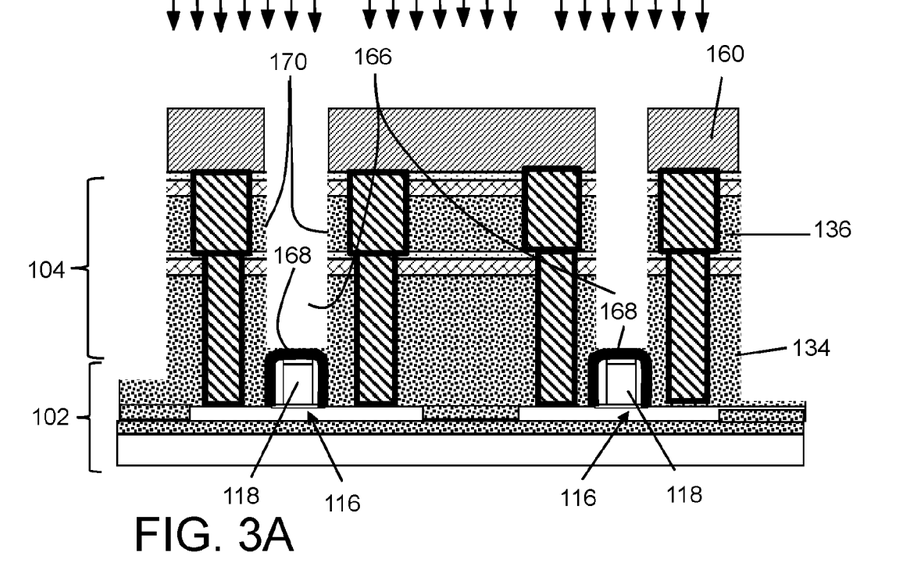
FIGS. 3A-E show cross-sectional views of etching an opening according to embodiments of a method of the disclosure.
Figure 3B:
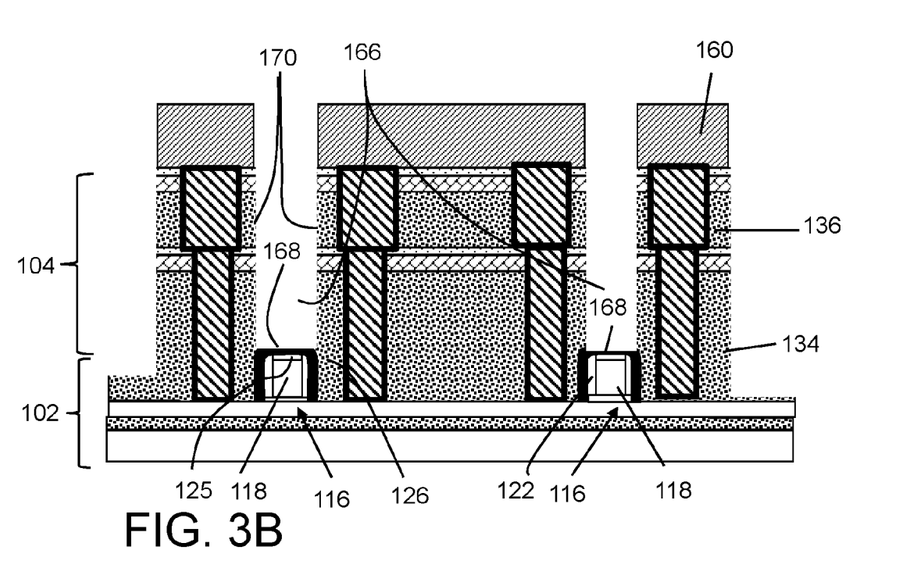
Figure 3C:
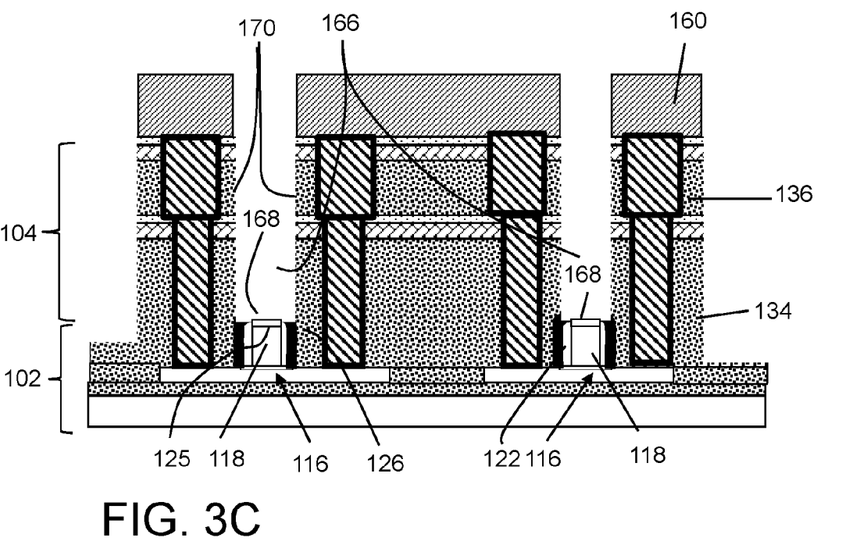
Figure 3D:
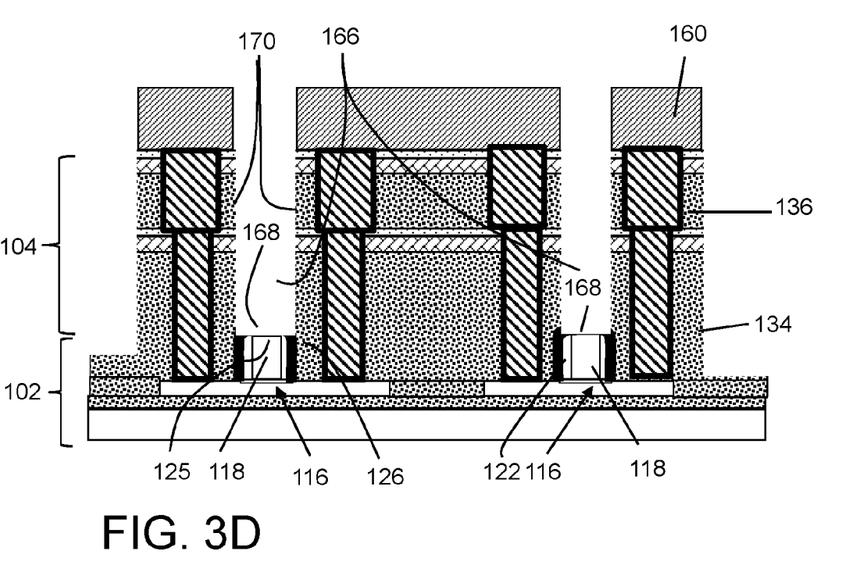
Figure 3E:
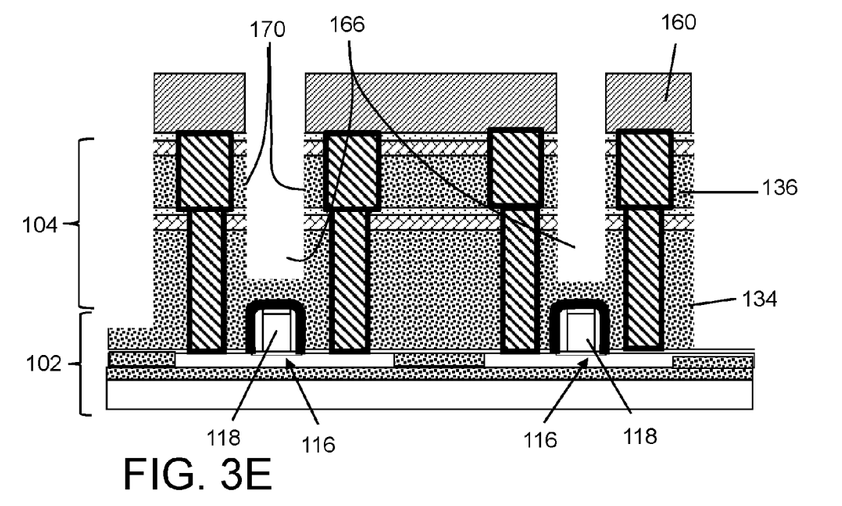

As shown in FIGS. 3A-E, opening 166 may extend above transistor gate 118 to a number of different depths. With regard to opening 166 depth, etching opening 166 may cease when: opening 166 meets or extends to etch stop layer 126 (FIG. 3A); recesses etch stop layer 126 (FIG. 3B); removes (extends beyond) etch stop layer 126 exposing silicide layer 125 (FIG. 3C); exposes body 120 (FIG. 3D), e.g., if silicide layer 125 is not present or has been removed entirely; or does not expose etch stop layer 126 by not extending through dielectric layer 134 above gate 118 (FIG. 3E). Accordingly, the etching of FIGS. 3A-E can be controlled to select the extent of exposure of an upper surface 168 of transistor gate 118.

Figure 4:
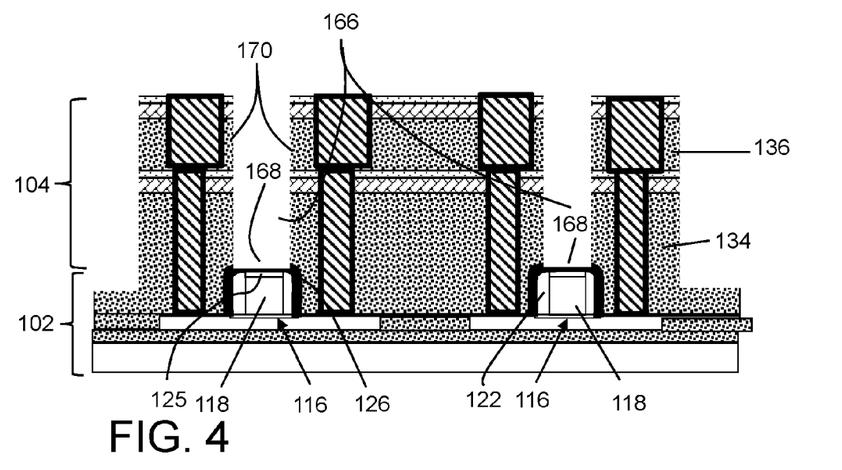
FIG. 4 shows a cross-sectional view of removing an air gap mask according to embodiments of the disclosure.

FIG. 4 shows the semiconductor device after removing air gap mask 160 (on the FIG. 3B embodiment only for brevity). Air gap mask 160 (FIGS. 3A-E) may be removed using any now known or later developed resist strip, in-situ or ex-situ.

Figure 5:
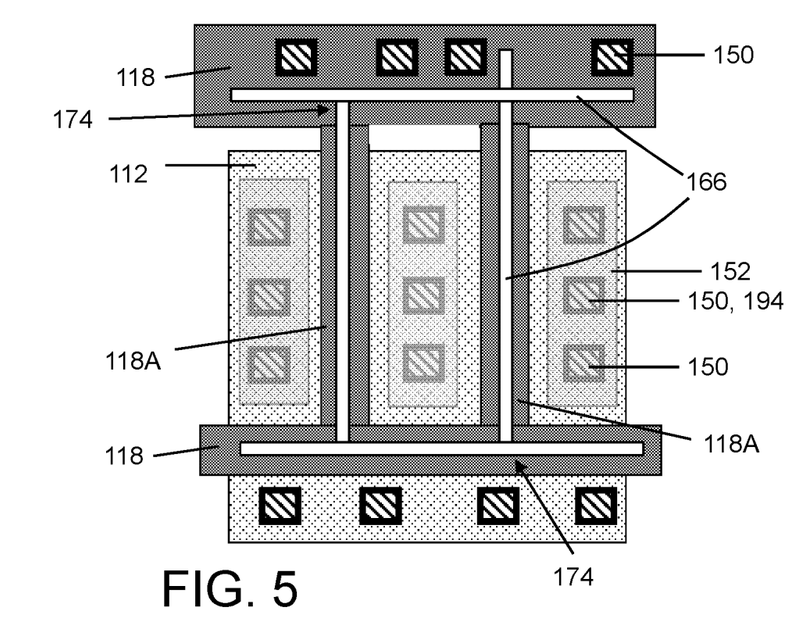
FIGS. 5-7 show plan views of embodiments of a structure partially through a method according to the disclosure.
Figure 6:
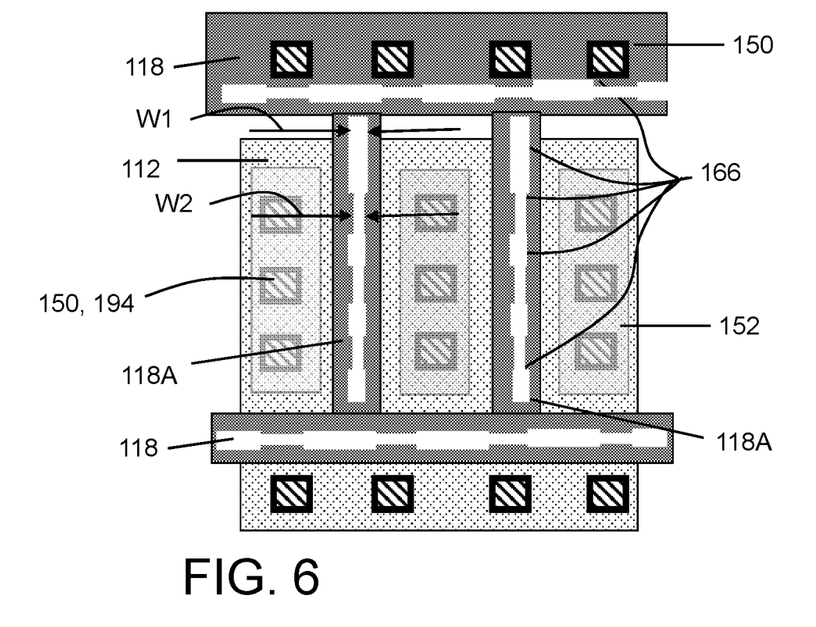
Figure 7:
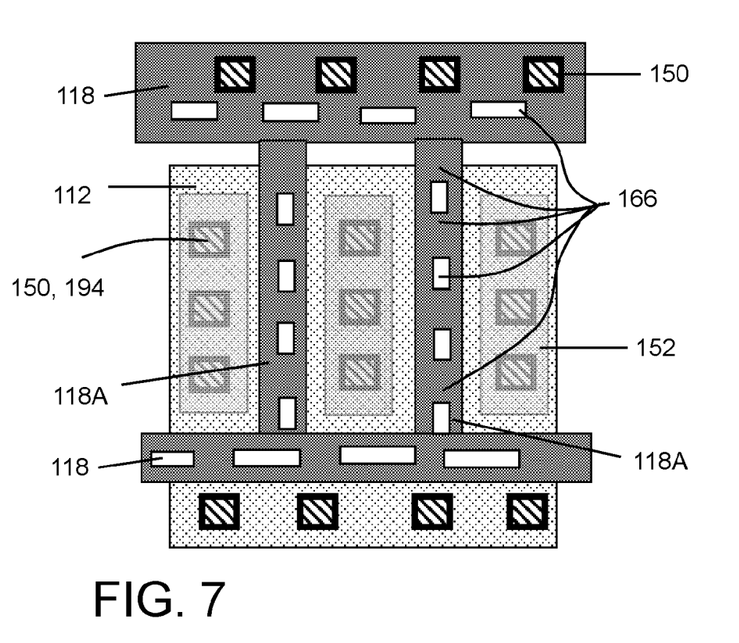
Figure 10:
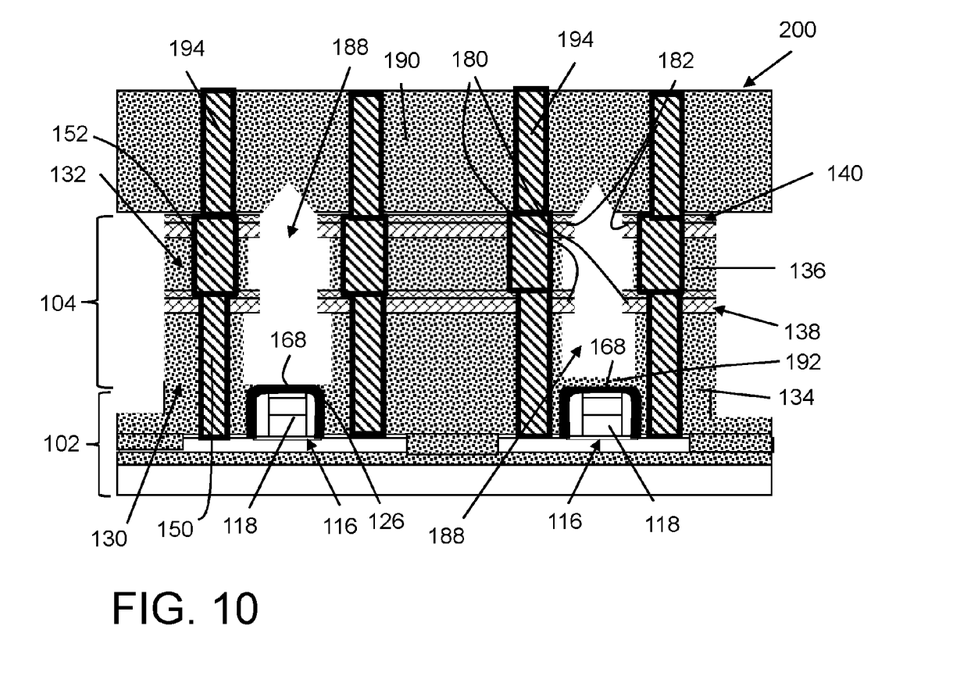
FIG. 10 shows a cross-sectional view of a method and a semiconductor device such as a radio frequency SOI switch with an air gap over a transistor gate thereof according to embodiments of the disclosure.
Figure 11:
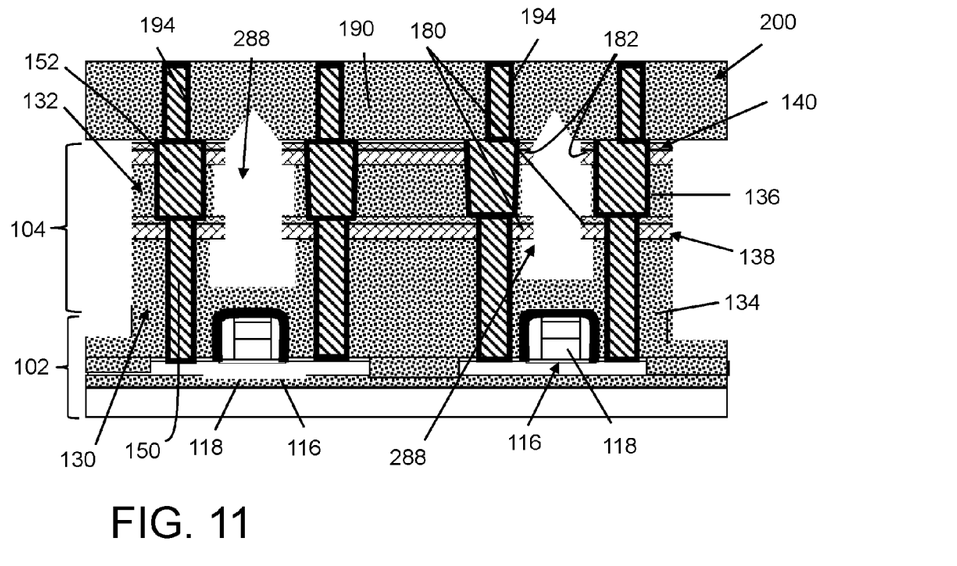
FIGS. 11 and 12 shows cross-sectional views of alternative methods and alternative semiconductor devices with an air gap over a transistor gate thereof according to embodiments of the disclosure.
Figure 12:
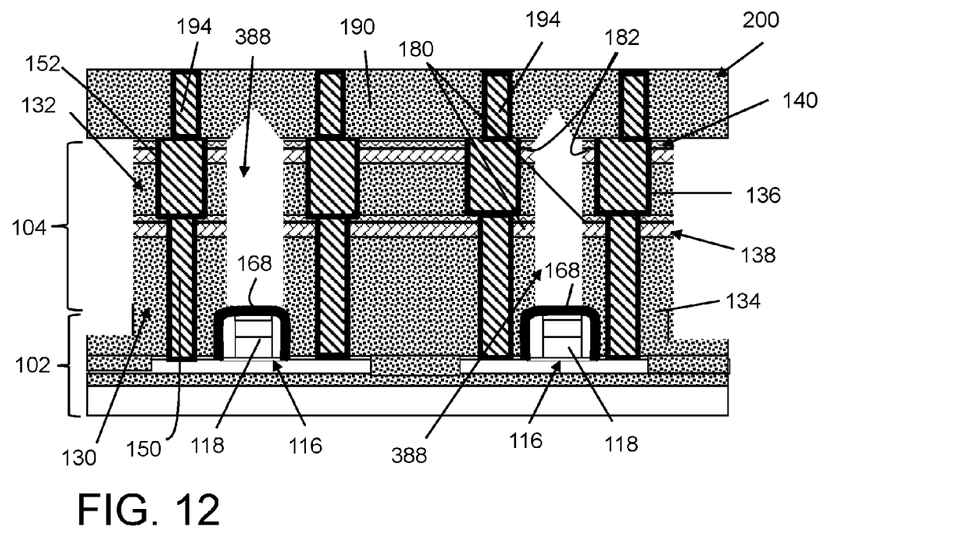

FIGS. 5-7 show plan or top views of embodiments of the structure after FIG. 4 processing, i.e., partially through the methods according to the disclosure. FIGS. 5-7 illustrate example layouts of openings 166, and hence, air gaps 188 (FIG. 10) to be formed thereby, as will be described herein. The cross-sections of FIGS. 5-7 are taken through dielectric 134 in FIG. 4. FIGS. 5-7 show SOI layer 112 (active area) having gates 118 formed thereover with contacts 150 extending from gate 118 and SOI layer 112. Metal wires 152 are shown coupling certain contacts 150 over SOI layer 112. As illustrated metal wires 152 run parallel to certain gates, labeled 118A. As illustrated, openings 166 can take a variety of forms. In FIG. 5, openings 166 are etched as laterally elongate openings above transistor gate 118. That is, rather than simple vertical openings, openings 166 have a length, e.g., just short of a transistor gate 118 that they parallel. In one embodiment, although not necessary, a portion of opening 166 may be etched in a laterally disposed T-shape 174, i.e., in a T-shape laid out horizontally in the plane of the page. In any event, openings 166 do not expose contacts 150 or metal wires 152, i.e., some of dielectric 134, 136 (FIG. 4) remains between contacts 150 and wires 152 and openings 166. In FIG. 6, openings 166 through interconnect layer 104 may be designed such that they are narrower adjacent to contacts 150 (or subsequently formed vias 194 (FIGS. 10-12)) to reduce the likelihood of contact 150 intersecting air gap 188 (FIG. 10). That is, opening 166 may be narrower (width W2) laterally adjacent a contact 150 (or vias 194 (FIGS. 10-12)) and wider (width W1) laterally between contacts 150 (or vias 194 (FIGS. 10-12)) to reduce the likelihood of contact 150 (or via 194) being exposed by air gap 188, which would allow filling of air gap 188 with a conductor. Consequently, air gap 188 (FIGS. 10-12) may have the same layout, i.e., as shown in FIG. 6, with a first width W1 laterally adjacent a contact 150 (or via 194) and a second width W2 wider than first width W1 laterally between contacts 150 (or vias 194). The variable width can occur in local interconnect layer 130 and/or first metal layer 132 and/or subsequent layers 190 (FIGS. 10-12). That is, air gap 188 would have a similar width variation regardless of whether viewed through local interconnect layer 130, first metal layer 132 or a subsequent air gap capping layer 190 (FIGS. 10-12). In FIG. 7, openings 166 may be etched as many, not necessarily elongated, disconnected openings. Here, some of openings 166 in FIG. 7 are designed not to be adjacent to contact 150 (or subsequently formed vias 194 (FIGS. 10-12)) to reduce the likelihood of contact 150 or via 194 intersecting air gap 188 (FIGS. 8A-C), which would allow filling of air gap 188 with a conductor. Selecting amongst the various lengths of opening 166 shown in FIGS. 5-7, one can eventually establish air gaps 188 (FIG. 10) that will optimally reduce on-resistance and off-capacitance of a semiconductor device 200 (FIG. 10) by reducing an effective dielectric constant for interconnect layer 104, and avoid shorts by openings 166 exposing a contact 150, via 194 (FIGS. 10-12) or wire 152. Air gap openings 166 may also be formed with different widths, as shown in FIG. 6. Air gap opening 166 width may be reduced in width, for example, near contacts 150 or vias 194 to reduce the likelihood of the air gap 188 intersecting the contacts or vias, due to misalignment.

Figure 8A:
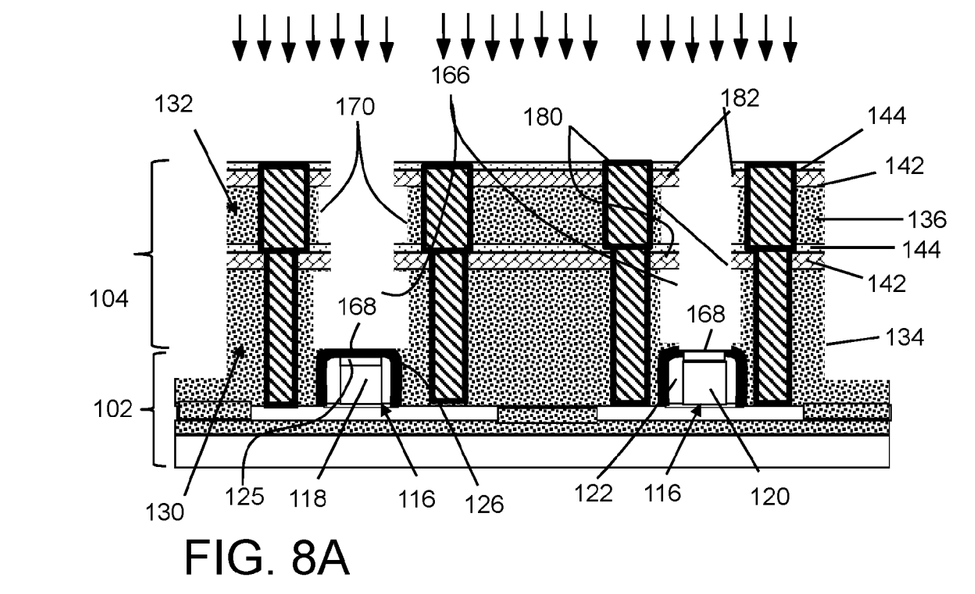
FIG. 8A-C show cross-sectional views of recessing an opening according to embodiments of the disclosure.
Figure 8B:
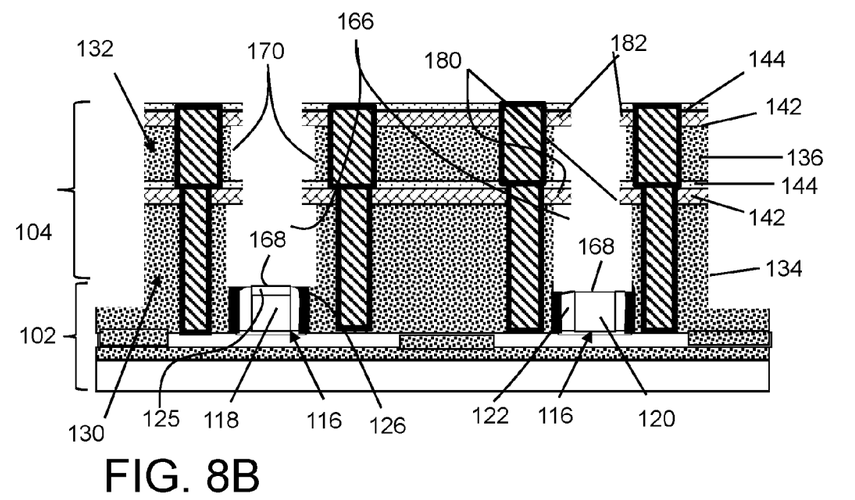
Figure 8C:
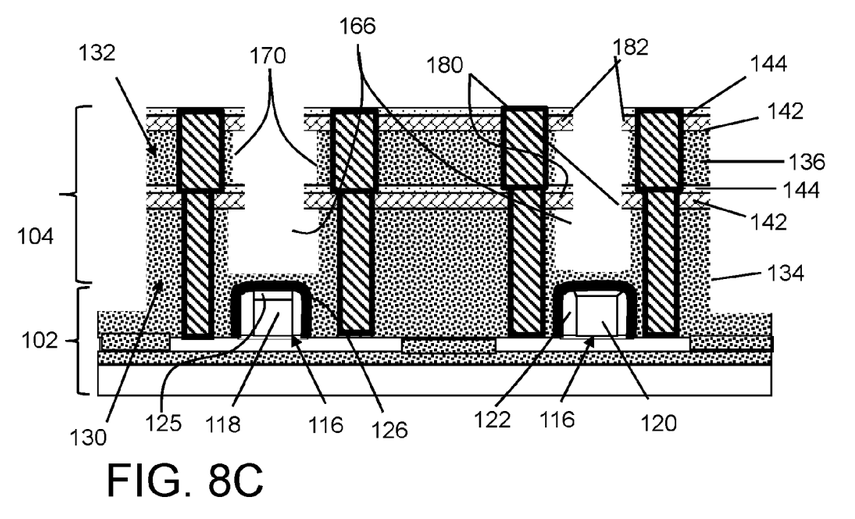

FIGS. 8A-C show an optional recessing of exposed sidewalls 170 of dielectric 134, 136 of interconnect layer 104 in opening 166. Among other benefits, recessing sidewalls 170 acts to enlarge opening 166 and thus air gaps 188 (FIG. 10), reducing the effective dielectric constant of interconnect layer 104 while leaving the air gap top opening to be sealed in the next process step narrower than the air gap itself. If silicon oxide films are used for local interconnect and first metal layers 130, 132 and silicon nitride is used for cap layer(s) 138, 140, then a hydrofluoric acid (HF) wet etch could be used for this recess (indicated by arrows in FIG. 3A only for brevity). HF concentrations could be in the range of 10:1 to 500:1 dilution with water, as known in the art.

Figure 9:
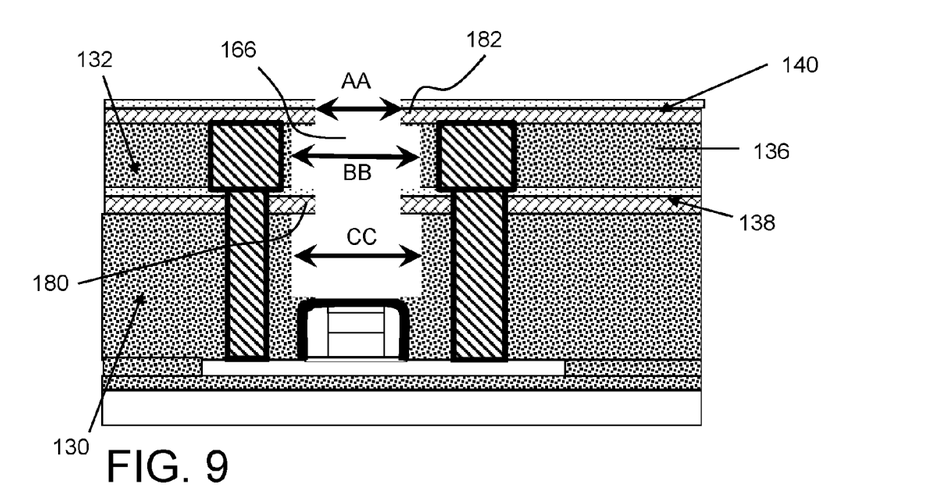
FIG. 9 shows an enlarged cross-sectional view of a detail per the FIG. 8B embodiment.

Because dielectrics of layers 130 and 132 etch faster than the dielectric of cap layer(s) 138, 140 (FIG. 1), FIG. 9 shows that opening widths BB and CC are wider than air gap top opening AA. The recessing may include, for example, a wet etch as described elsewhere herein. In one embodiment, shown in FIGS. 8A-C and 9, recessing exposed sidewalls 170 of dielectric 134, 136 of interconnect layer 104 in opening 166 may expose an edge 180, 182 of at least one of the local interconnect cap layer 130 and first metal cap layer 132 in opening 166. As will be described, edges 182 assist in closing opening 166 to form an air gap, e.g., by facilitating the pinching off of opening 166.

As shown in FIGS. 8A-C, recessing at this stage can also be used to further deepen opening 166. Assuming, for example, recessing occurred after air gap mask removal 160 in FIG. 4, but with the FIG. 3E embodiment in which dielectric layer 134 remains above transistor gate 118, recessing as shown in FIGS. 8A-C can further deepen opening 166 to any of the depths shown in FIGS. 3A-E. For example, where opening 166 did not extend through dielectric layer 134 to meet or contact etch stop layer 126, recessing may extend opening 166 thereto (FIG. 8A, left side). Similarly, recessing could extend opening 166 to recess etch stop layer 126 (FIG. 8A, right side) or expose silicide 125 (FIG. 8B, left side), or expose body 120 (FIG. 8B, right side). Further, recessing could extend opening 166 further into dielectric layer 134 but not expose any of gate 118 (FIG. 8C). In this fashion, the extent to which transistor gate 118 is exposed to an air gap 188 (FIG. 10) formed from opening 166 can be precisely controlled in addition to the control provided by the etching of FIGS. 3A-E.

FIG. 10 shows forming an air gap 188 over transistor gate 118 by depositing an air gap capping layer 190 to seal opening 166 (FIG. 9) at a surface of interconnect layer 104. As shown, air gap 188 is vertically aligned with transistor gate 118, although perfect alignment is not necessary in all cases. Air gap capping layer 190 may include any dielectric material capable of sealing opening 166 and acting as an ILD for a first via layer (not shown) to be formed therein. In one embodiment, air gap capping layer 190 may include chemical vapor deposited (CVD) dielectric. In another embodiment, air gap capping layer 190 may include a plasma-enhanced chemical vapor deposition (PECVD) silane oxide. PECVD silane oxide may be chosen because it has very poor step coverage, resulting in a larger air gap volume. In other embodiments, air gap capping layer 190 may include a thin silicon nitride layer with an ILD oxide, such as a PECVD TEOS-based, PVD, or similar oxide (individual layers not shown for clarity). Edges 182 of first metal cap layer 140 (FIG. 1) of first metal layer 132 act to pinch opening 166 to assist in closing air gap 188. Air gap 188 does not expose any contact 150 or metal wire 152, i.e., dielectric 134, 136 of interconnect layer 104 about air gap 188 covers any conductive wire 152 in first metal layer 132 or any conductive contact 150 in local interconnect layer 130. Air gap 188 may have any of the lateral layouts of opening 166, as shown in FIGS. 5-7. Further, first metal layer 132 may include a metal wire 152 (FIG. 10) extending laterally parallel to transistor gate 118 (see FIGS. 5-7) in device layer 102. As shown in FIG. 10, air gap 188 vertically extends above and below metal wire 152, i.e., below dielectric 136 of first metal layer 132 and above metal wire 152 in cap layer 190. Most notably, air gap 188 extends above an upper surface of first metal layer 132. As also shown in FIG. 10, air gap 188 may vertically extend only partially into air gap capping layer 190 so that layer 190 can act as a first via layer ILD with minimal interference from air gap 188. Vias 194 to another metal layer (not shown) may be formed in air gap capping layer 190, using any conventional or later developed technique. As shown on the right side of FIG. 10 only, a thin layer 192 of air gap capping layer 190 may selectively cover transistor gate 118 in opening 116, thus providing additional control over the extent to which transistor gate 118 is exposed to air gap 188. Air gap capping layer 190 seals opening 166 regardless of the lateral layout it takes from FIGS. 5-7, e.g., elongated or a non-elongated smaller opening, T-shaped or varying width (FIG. 6). As noted herein, the lateral formation of opening 166 (described relative to FIGS. 5-7) can be controlled to avoid exposing thereof by subsequently formed vias 194, thus preventing via 194 conductor from entering air gap 188.

Alternative air gap embodiments are shown in FIGS. 11 and 12. FIG. 11 shows an air gap 288 which has a shallower etch depth (FIGS. 3A-E) to avoid touching transistor gate 118. FIG. 12 shows an air gap 388 which had the recess etch shown in FIGS. 8A-C reduced or eliminated. This structure has a smaller air gap 388 than shown in FIG. 11 but avoids exposing the dielectrics of local interconnect layer 130 and first metal layer 132 to the etchant.

Referring to FIGS. 10-12, a semiconductor device 200 according to embodiments of the disclosure is also shown. In one embodiment, semiconductor device 200 may include transistor gate 118 in device layer 102. Transistor gate 118 may include body 120, silicide layer 125 over body 120, and etch stop layer 126 over silicide layer 125. Transistor 116 can take the form of any now known or later developed complementary metal-oxide semiconductor (CMOS) field effect transistor (FET). Semiconductor device 200 can also include interconnect layer 104 over device layer 102. Interconnect layer 104 may include one or more interconnect layers, for example, local interconnect layer 130 and first metal layer 132. Semiconductor device 200 also includes air gap 188 extending through interconnect layer 104 above transistor gate 118. As described, the extent to which transistor gate 118, i.e., upper surface 168 thereof, is exposed and/or what part of gate 118 is exposed to air gap 188 can be controlled through the etching, recessing and capping processes. As understood, air gap 188 can be formed with any embodiment of opening 166 provided. That is, air gap 188 may meet or extend to etch stop layer 126 (left side of FIG. 10); extend into etch stop layer 126 (see FIGS. 3B, 4 and 8A, right side) not exposing silicide layer 125; remove etch stop layer 126 (and perhaps parts of spacers 122) exposing silicide layer 125 (FIG. 3C, left of FIG. 8B); if silicide layer 125 is not present or has been removed entirely, expose a portion of body 120 (FIG. 3D, right side of FIG. 8B); or if a thin layer 192 of capping layer 190 has been deposited into opening 166 (right side of FIG. 10) or opening 166 does not extend through dielectric layer 134 (FIGS. 3E, 8C and 11), extend to thin layer 192 of capping layer 190 or dielectric layer 134 over transistor gate 118. Consequently, above transistor gate 118, an air gap may contact dielectric such as dielectric layer 134 or thin layer 192 of cap layer 190, contact etch top layer 126 (either full or recessed), contact silicide layer 125 or contact body 120 of transistor gate 118. In any event, dielectric 134, 136 of interconnect layer 104 about air gap 188 covers any conductor, e.g., any conductive wire 152 in first metal layer 132 or any conductive contact 150 in local interconnect layer 130. Edges 180 and/or 182 of at least one of local interconnect cap layer(s) 138 and first metal cap layer(s) 140 may extend into air gap 188. As shown in FIG. 9, first metal cap layer 140 may have a width AA in the air gap (where opening 166 is positioned in FIG. 9) that is less than a width BB of the air gap (where opening 166 is positioned in FIG. 9) in dielectric 136 of first metal layer 132 below first metal cap layer 140. As such, edges 182 of first metal cap layer 140 act to pinch off dielectric 190, allowing for a lesser amount of dielectric 190 to seal opening 166.

At least a portion of etch stop layer 126 of transistor gate 118 may be recessed (FIGS. 4 and 8). In one embodiment, air gap 188 may have a height-to-width ratio greater than approximately 3 to 1, e.g., 4 to 1. In one embodiment, air gap 188 may have a width of approximately 1-2 um, and a height of approximately 8-10 um. As shown in FIG. 5, air gap 188 may be laterally elongated or T-shaped-like opening 166 used to form it.

As will be recognized, semiconductor device 200 can be used to form a variety of devices such as a radio frequency semiconductor-on-insulator (RFSOI) switch, a low amplitude amplifier, a power amplifier, etc. Use of air gap 188, 288 or 388 over transistor gate 118 according to the various embodiments of the disclosure provides a mechanism to reduce off-capacitance and on-resistance of any device using it by controlling one of the main contributors of intrinsic FET capacitance: the effective dielectric constant of local interconnect layer 130 and first metal layer 132. In one example, an off-capacitance reduction of between approximately 15-60% was observed, with an effective dielectric constant of interconnect layer 104 lowered from approximately 4 to 2 using air gap 188, 288 or 388.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor device, comprising:
   a transistor gate in a device layer;
   an interconnect layer over the device layer, the interconnect layer including a dielectric layer and a first metal layer over the dielectric layer, the dielectric layer being composed of a single dielectric material; and
   an air gap extending through the interconnect layer above the transistor gate, wherein a single portion of the dielectric layer of the interconnect layer is disposed between the air gap and any conductive via in the dielectric layer adjacent to the air gap such that the single portion of the dielectric layer directly contacts both the airgap and the any conductive via;
   wherein the interconnect layer includes a local interconnect cap layer at an upper surface of the dielectric layer, and the first metal layer includes a first metal cap layer at an upper surface thereof, and an edge of at least one of the local interconnect cap layer and the first metal cap layer extends into the air gap.

2. The semiconductor device of claim 1, wherein the dielectric layer is part of a local interconnect layer of the interconnect layer disposed over the device layer.

3. The semiconductor device of claim 1, wherein a width of the air gap in the first metal cap layer is less than a width of the air gap in a dielectric of the first metal layer below the first metal cap layer.

4. The semiconductor device of claim 1, wherein the first metal layer includes a metal wire extending laterally parallel to the transistor gate in the device layer, and wherein the air gap vertically extends above and below the metal wire.

5. The semiconductor device of claim 1, wherein the air gap vertically extends only partially into an air gap capping layer above the first metal layer.

6. The semiconductor device of claim 5, wherein the air gap capping layer includes a dielectric material.

7. The semiconductor device of claim 6, wherein the dielectric material includes silicon oxide.

8. The semiconductor device of claim 1, wherein the transistor gate includes a body, a silicide layer over the body and an etch stop layer over the silicide layer.

9. The semiconductor device of claim 8, wherein the air gap contacts the etch stop layer.

10. The semiconductor device of claim 1, wherein the air gap is laterally elongated.

11. The semiconductor device of claim 1, wherein the air gap has a first width laterally adjacent a contact or a via and a second width wider than the first width laterally between contacts or vias.

12. A radio frequency semiconductor-on-insulator (RF-SOI) switch, comprising:
   a transistor gate in a semiconductor-on-insulator (SOI) layer of an SOI substrate;
   an interconnect layer over the SOI layer, the interconnect layer including a local interconnect layer over the SOI layer and a first metal layer over the local interconnect layer, wherein the interconnect layer includes at least one dielectric layer, the at least one dielectric layer being composed of a single dielectric material; and
   an air gap extending through the at least one dielectric layer above the transistor gate,
   wherein a single portion of the at least one dielectric layer of the interconnect layer is disposed between the air gap and any conductive wire in the first metal layer adjacent to the air gap; and
   wherein the single portion of the at least one dielectric layer of the interconnect layer is interposed between the air gap and any conductive via in the local interconnect layer adjacent to the air gap; and
   wherein the interconnect layer includes a local interconnect cap layer at an upper surface of the local interconnect layer, and the first metal layer includes a first metal cap layer at an upper surface thereof, and an edge of at least one of the local interconnect cap layer and the first metal cap layer extends into the air gap.

13. The RFSOI switch of claim 12, wherein the transistor gate includes a body, a silicide layer over the body and an etch stop layer over the silicide layer, and wherein the air gap contacts one of the etch stop layer, the silicide layer and the body of the transistor gate.

14. The RFSOI switch of claim 12, wherein the air gap has a first width laterally adjacent a contact or a via and a second width wider than the first width laterally between contacts or vias.

15. The RFSOI switch of claim 12, wherein the air gap vertically extends only partially into an air gap capping layer above the first metal layer.

16. The semiconductor device of claim 3, wherein the air gap within the first metal cap layer is a single opening.

17. The RFSOI switch of claim 12, wherein the single portion of the at least one dielectric layer directly contacts both the airgap and the any conductive via in the first metal layer, and wherein the single portion of the at least one dielectric layer directly contacts both the airgap and the any conductive via in the local interconnect layer.

18. A semiconductor device, comprising:
   a transistor gate in a device layer;
   an interconnect layer over the device layer, the interconnect layer including:
      a dielectric layer, the dielectric layer being composed of a single dielectric material,
      a cap layer over the dielectric layer, and
      a first metal layer over the cap layer; and
   an air gap extending through the interconnect layer above the transistor gate,
   wherein a portion of the dielectric layer of the interconnect layer is disposed between the air gap and any conductive via in the dielectric layer adjacent to the air gap, and
   wherein a width of the air gap in the cap layer is less than a width of the air gap in the dielectric layer, and
   wherein the width of the air gap in the cap layer is less than a width of the air gap in the first metal layer.

* * * * *